United States Patent [19]

Takayanagi

[11] Patent Number: 5,317,201
[45] Date of Patent: May 31, 1994

[54] LOGICAL CIRCUIT FOR DETECTING A POTENTIAL

[75] Inventor: Toshinari Takayanagi, Iwakura, Japan

[73] Assignee: Kabushiki Kaisha Toshiba, Kanagawa, Japan

[21] Appl. No.: 873,112

[22] Filed: Apr. 24, 1992

[30] Foreign Application Priority Data

Apr. 26, 1991 [JP] Japan .................................. 3-097552

[51] Int. Cl.⁵ .............................................. H03K 3/01
[52] U.S. Cl. .............................. 307/296.1; 307/296.6; 365/226
[58] Field of Search ............... 307/296.1, 296.6, 296.8, 307/491; 365/226

[56] References Cited

U.S. PATENT DOCUMENTS

| | | | |
|---|---|---|---|
| 4,950,921 | 8/1990 | Takada | 307/296.1 |
| 4,964,084 | 10/1990 | Jung et al. | 365/226 |
| 5,023,476 | 6/1991 | Watanabe et al. | 307/296.6 |
| 5,077,518 | 12/1991 | Han | 365/226 |
| 5,121,007 | 6/1992 | Aizaki | 365/226 |
| 5,132,565 | 7/1992 | Kuzumoto | 307/296.8 |
| 5,184,031 | 2/1993 | Hayakawa et al. | 307/296.1 |

OTHER PUBLICATIONS

Neil Weste, "Principle of CMOS VLSI Design", pp. 506-510, Jun. 1988.

Primary Examiner—Timothy P. Callahan
Assistant Examiner—Toan Tran
Attorney, Agent, or Firm—Finnegan, Henderson, Farabow, Garrett & Dunner

[57] ABSTRACT

A logical circuit includes an inverter circuit for judging fluctuations of a potential at a potential detecting point, a power-source potential step-down circuit for supplying a potential between a potential at a switching point of the inverter circuit and a high-level power-source potential, from an output end thereof, a MOS transistor of P-channel for controlling in conductivity a location between the output end of the power-source potential step-down circuit and the potential detecting point, and a group of MOS transistors of N-channel for controlling in conductivity a location between the potential detecting point and a ground power source in accordance with an input signal.

14 Claims, 8 Drawing Sheets

LOGICAL CIRCUIT FOR DETECTING A POTENTIAL

BACKGROUND OF THE INVENTION

1. Field of the Invention

The present invention relates to a logical circuit for detecting an electric potential, with a high speed, at a potential detecting point relatively large in load, on the basis of a clock signal and an input signal.

2. Description of the Prior Art

FIG. 1 of the attached drawings is a view showing an arrangement of a CMOS logical circuit of dynamic type, while FIG. 2 is a view showing operational timing of the logical circuit illustrated in FIG. 1.

As shown in FIG. 1, the logical circuit is controlled in conductivity by a clock signal $\phi$, and comprises a MOS transistor (hereinafter referred to as "PMOS") 101 of the P-channel type which pre-charges a potential detecting point to high-order power-source potential (series connecting point) N1, a logical switch 102 connected in series to the PMOS 101 through the series connecting point N1 for short-circuiting the connecting point N1 and a ground power-source potential $V_{SS}$ on the basis of a plurality of inputs $I_1$-$I_n$ and an inverter circuit 103 for detecting a change or variation in potential at the connecting point N1. In this connection, a capacitance 104 connected to the connecting point N1 indicates a parasitic capacitance added to the connecting point N1.

Accordingly, as shown in FIG. 2, the logical circuit is arranged such that the series connecting point N1 between the PMOS 101 and the logical switch 102 is pre-charged to the high-order power-source potential $V_{DD}$ by the PMOS 101 under that conductive condition within a pre-charge period of time, the logical switch 102 subsequently short-circuits the ground point N1 and the ground power-source potential $V_{SS}$ to each other on the basis of inputs $I_1$-$I_n$ during an evaluation period of time, to bring the connecting point N1 to the ground potential, and this change in potential is detected by the inverter circuit 103 and is outputted.

With the arrangement of the logical circuit, the following disadvantage occurs. That is, in the case where the load capacitance 104 at the connecting point N1 is large, the logical switch 102 alters the potential at the connecting point N1 so that, as shown in FIG. 2, the time $T_{EV}$ until the potential at the connecting point N1 descends from the power-source potential $V_{DD}$ to a potential $V_S$ at the switching point of the inverter circuit 103 is increased. Thus, detection of the potential change at the connecting point N1 is delayed.

In view of the above, there is a method in which, in order to dissolve the above-discussed deficiency, a circuit constant of FET forming the inverter circuit 103, for example, threshold voltage is altered or changed whereby the potential $V_S$ at a witching point moves toward the power-source potential. Generally, however, it is difficult to largely move the switching point of the inverter circuit. Further, although detection of a change in potential from a high level to a low level is quickened by moving the switching point $V_S$ at the switching point toward $V_{DD}$, detection from the low level to the high level is slowed down a great deal. Thus, the method has such a disadvantage that a balance of the detection is deteriorated.

On the other hand, as another method for avoiding of the above-discussed deficiency, as shown in FIG. 3, there is a method in which a transistor pre-charging the connecting point N1 is formed by an NMOS 105, and a pre-charge level at the connecting point N1 is brought to $V_{DD}$-$V_{TN}$ ($V_{TN}$ is threshold voltage of the NMOS 105). However this method has the following problem. That is, the pre-charge level the connecting point N1 is liable to fluctuate so that an operating margin is reduced. Furthermore, the case where the connecting point N1 is not discharged for a long period of time, the potential at the connecting point N1 is raised to the power-source potential $V_{DD}$ by leak current in the NMOS 105 at non-conducting. Thus, the potential cannot be detected with a high speed.

As described above, the conventional logical circuit of the dynamic type, which detects a change in potential, causes the following deficiency. That is, high-speed detection of the potential is difficult in the case where the load capacitance at the potential detecting point is large, and if an attempt is made to execute the potential detection with high speed, the balance of detection is deteriorated, and the operational margin is reduced.

SUMMARY OF THE INVENTION

The invention has been made in view of the above-described circumstances, and it is an object of the invention to provide a logical circuit capable of attaining detection of a potential change with high speed at low consumption power, without adversely affecting a detecting balance and an operational margin.

In order to achieve the above-described object, the invention is characterized by comprising output means for judging change of a potential at a potential detecting point on the basis of a comparison with respect to a switching point thereof, voltage supply means for reducing a first power-source potential to a potential between a switching point of the output means and the first power-source, a first FET (field effect transistor) of a first conductive type for controlling an electrical conductivity between the output end of said voltage supply means and said potential detecting point, and switch means for controlling an electrical conductivity between said potential detecting point and a second power-source potential in accordance with an input signal, wherein, under a condition that the potential at the potential detecting point is set by the voltage supply means to a potential between the first power-source potential and a potential at the switching point of the output means, a potential change due to the input signal from the potential detecting point is detected.

These and other objects, features and advantages of the present invention will be more apparent from the following description of preferred embodiments, taken in conjunction with the accompanying drawings.

DETAILED DESCRIPTION OF THE PREFERRED EMBODIMENTS

Various embodiments of the invention will hereunder be described with reference to the accompanying drawings.

Figure 1:
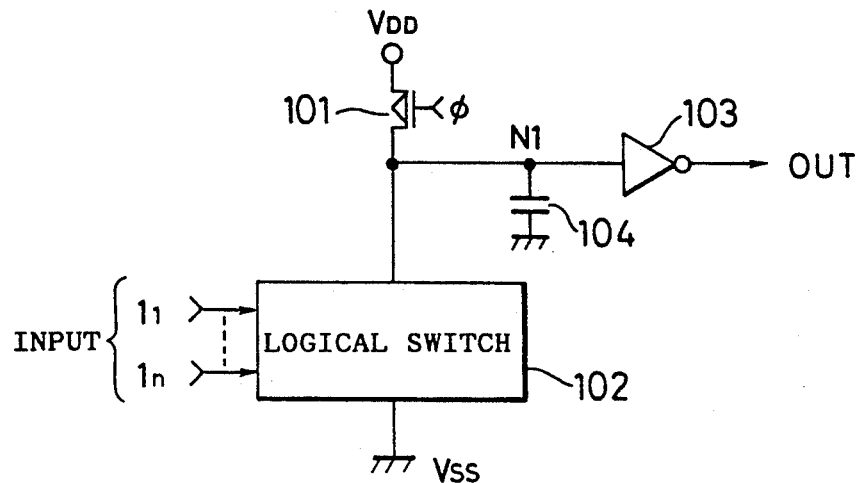
FIG. 1 is a view showing an arrangement of a conventional logical circuit of dynamic type.
Figure 2:
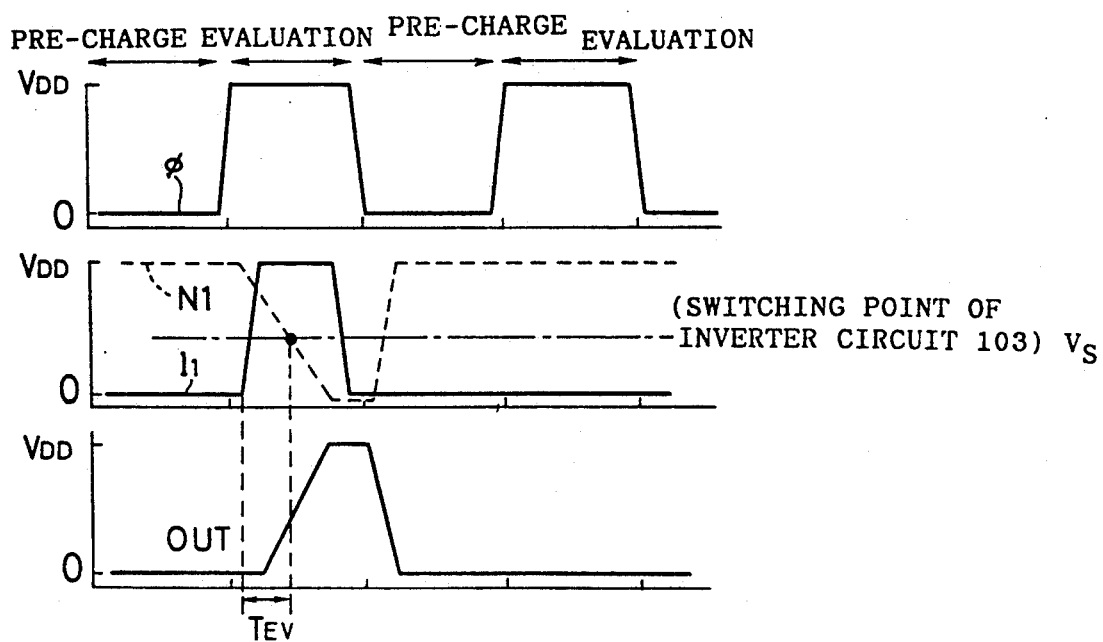
FIG. 2 is a view showing operational timing of the circuit illustrated in FIG. 1.
Figure 3:
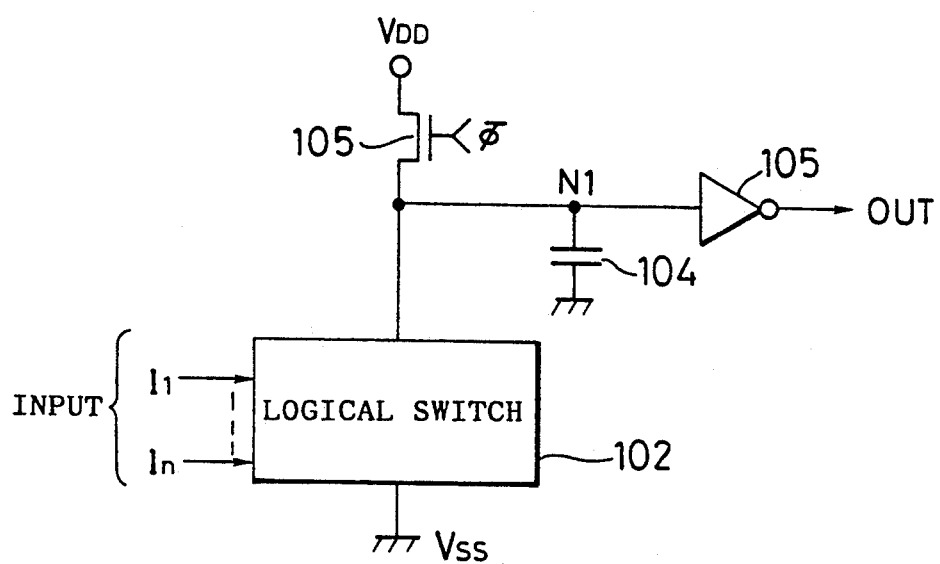
FIG. 3 is a view showing another arrangement of the conventional logical circuit of dynamic type.
Figure 4:
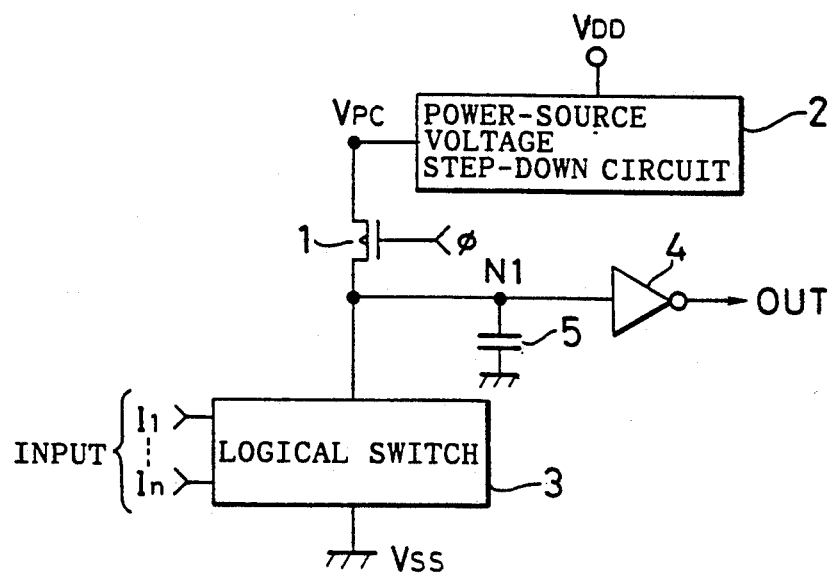
FIG. 4 is a view showing an arrangement of a logical circuit according to an embodiment of the invention.

Referring first to FIG. 4, there is shown an arrangement of a logical circuit according to an embodiment of the invention. The logical circuit according to the embodiment illustrated in FIG. 4 is arranged such that, under the condition where a detection point detecting a potential change is pre-charged to a high level in accordance with a clock signal, such a potential change that a potential at the detecting point reaches a ground potential is detected.

In FIG. 4, the logical circuit is arranged such that a pre-charging PMOS 1 controlled in conductivity in accordance with a clock signal $\phi$ is connected between an output end of a power-source voltage step-down circuit 2 for reducing a potential of a high-level power source $V_{DD}$ and a logical switch 3 controlled in conductivity to a ground potential $V_{SS}$ in accordance with input signals $I_1$–$I_n$, and its connecting point N1 is connected to an inverter circuit 4 which outputs inverted potential of the connecting point N1. In this connection, a capacitance 5 connected to the connecting point N1 is a parasitic capacitance added to the connecting point N1.

Figure 5:
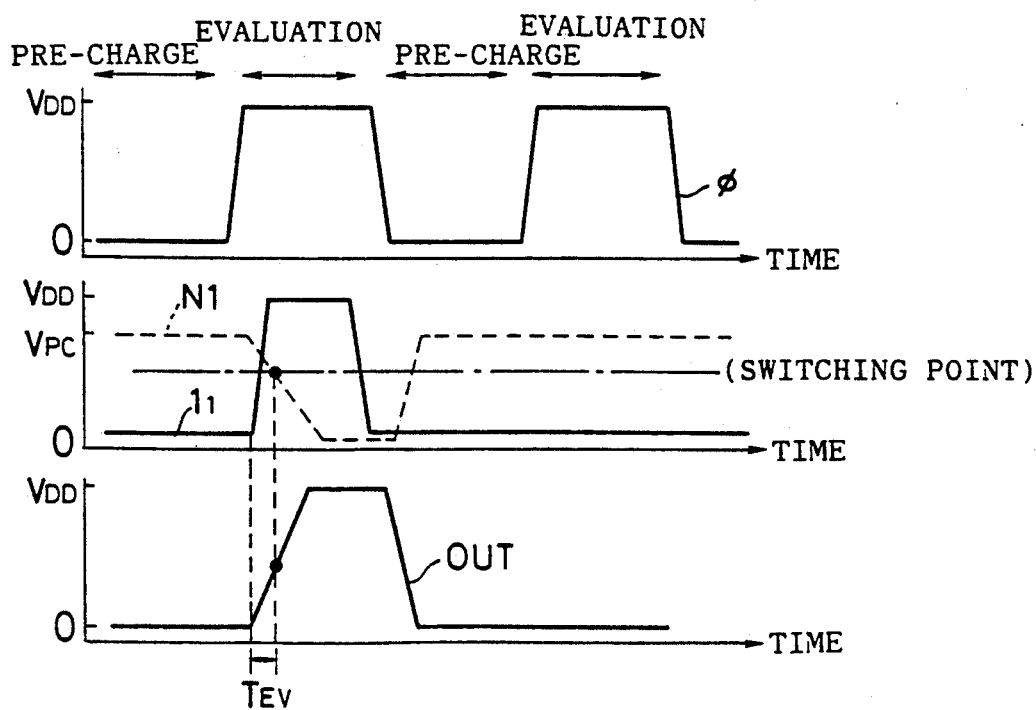
FIG. 5 is a view showing operational timing of the circuit illustrated in FIG. 4.

With the arrangement of the invention, as shown in an operational timing chart in FIG. 5, the logical circuit is arranged such that a pre-charge potential at the connecting point N1 is pre-charged by the power-source voltage step-down circuit 2 to a potential substantially intermediate between a potential (substantial half of the power-source potential $V_{DD}$) at a switching point of the inverter circuit 4 and the power-source potential $V_{DD}$, during a pre-charge period of time, such that, under this condition, the connecting point N1 and a ground power source are short-circuited to each other through the logical switch 3 on the basis of, for example, an input signal, and such that a potential change at this time is detected as an output from the inverter circuit 4.

Specifically, it is preferable in the logical circuit that the pre-charge potential at the connecting point N1, that is, an output potential of the power-source voltage step-down circuit 2 is set to a potential higher than $V_{DD} - 2|V_{TP}|$ (assmuming that the threshold voltage of the PMOS 1 is $V_{TP}$) in order to keep sufficient operational margin. It is further preferable for low-power-consumption operation to set the pre-charge potential around $V_{DD} - |V_{TP}|$.

Next, the reason for the above will be described with reference to the transfer characteristic of the CMOS inverter circuit illustrated in FIG. 6.

Figure 6:
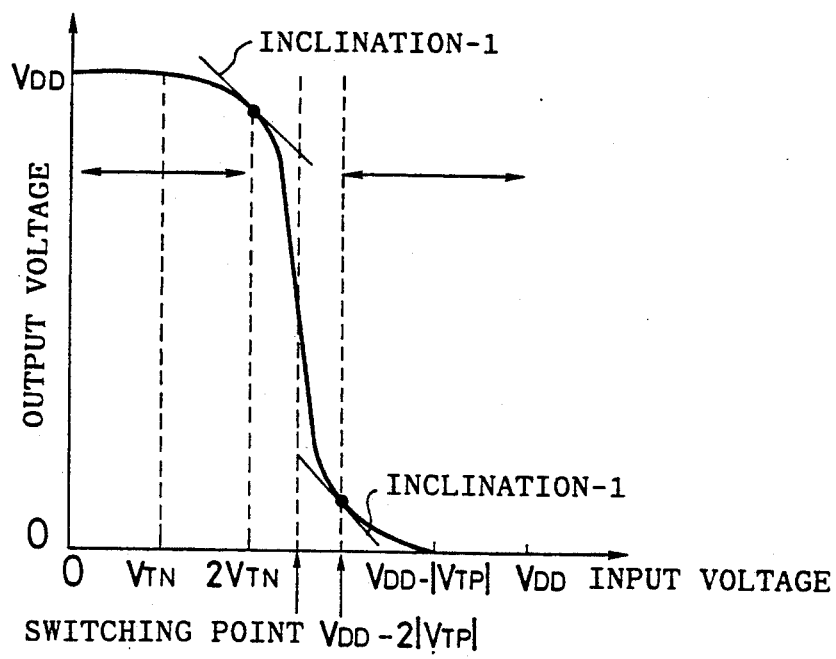
FIG. 6 is a view showing transfer characteristic of an inverter circuit.

In the transfer characteristic in FIG. 6 shown in the literature "Principle of CMOS VLSI Design, P506, written by Neil Weste", a range of the input voltage ($V_i$) in which the operational margin is secured is defined as being $|dV_o/dV_i|$ (inclination of the characteristic curve) $|<1$. This definition can be said as being proper or appropriate in the field of art.

In the definition, in order to simplify the description, assuming that $|V_{TP}|$ is equal to $V_{TN}$ ($V_{TN}$ is threshold voltage of the NMOS), that $(\beta_n/\beta_p)$ is equal to 1 ($\beta_p$ and $\beta_n$ are conductances of the PMOS and NMOS, respectively), and that a relationship between the power-source voltages $V_{DD}$ and $V_{TN}$ is set to a realistic value of $V_T = V_{DD}/5$, a range of the input voltage $V_i$ in which the operational margin is secured is:

$$0 \leq V_i < 17V_{TN}/8, \text{ and}$$

$$V_{DD} - (17|V_{TP}|/8) < V_i \leq V_{DD}$$

Thus, in a range within which the input voltage is from the power-source potential and the ground potential to a value twice an absolute value of the threshold voltages of the respective PMOS and NMOS, it can be concluded that the operational margin is secured. Particularly, in a range within which the input voltage $V_i$ is:

$$V_{DD} - |V_{TP}| \leq V_i V_{DD}$$

Since the PMOS which forms the inverter circuit 4 for detecting and outputting the potential change is completely brought to non-conducting condition, it is possible to realize further low consumption power and high operational margin.

Figure 7:
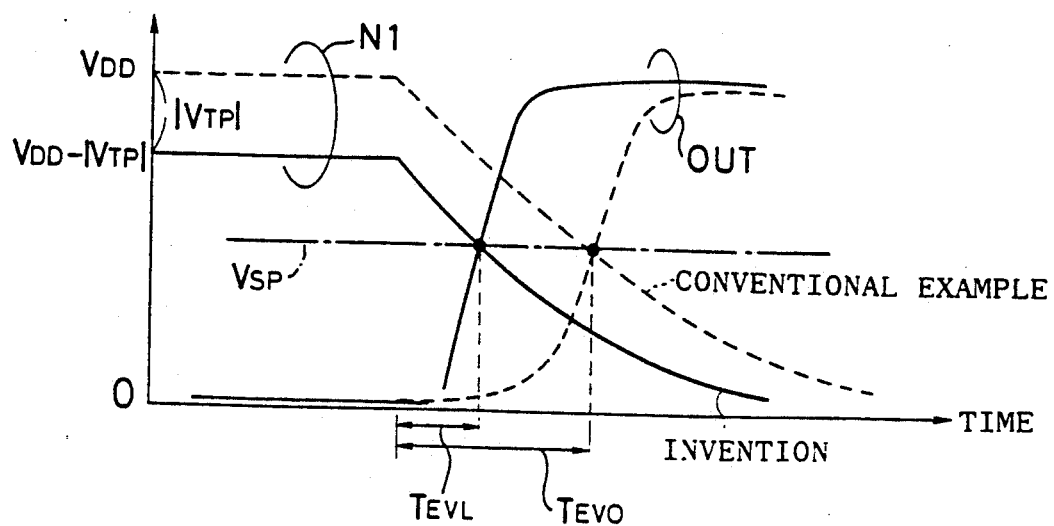
FIG. 7 is a view showing speed comparison between the invention and the conventional logical circuit.

In this manner, the pre-charge potential at the connecting point N1 is set lower than the power-source potential $V_{DD}$ under the condition that the operational margin is sufficiently secured, whereby, assuming that the pre-charge potential at the connecting point N1 is, for example, ($V_{DD} - |V_{TP}|$), and, for simplification of the description, $|V_{TP}|$ is equal to $V_{DD}/5$, and the potential $V_{SP}$ at the switching point of the inverter circuit 4 is $V_{DD}/2$, as shown in FIG. 7 illustrating the potential change at the connecting point N1 of the conventional example and the invention, time $T_{EV}$ until the potential at the connecting point N1 reaches the potential $V_{SP}$ at the switching point is considerably reduced or shortened ($T_{EV0} - T_{EV1}$) so that, as expressed by the following equation, it is possible to improve a detecting speed of the potential change by a value of the order of approximately 40%.

$$1 - \{(V_{DD}/2) - |V_{TP}|\}/(V_{DD}/2) = 1 - \{(V_{DD}/2) -$$

$$(V_{DD}/5)\}/(V_{DD}/2) = 1 - (3/5) = 40(\%)$$

Next, a more particular exemplified example of the logical circuit illustrated in FIG. 4 will be described.

Figure 8A:
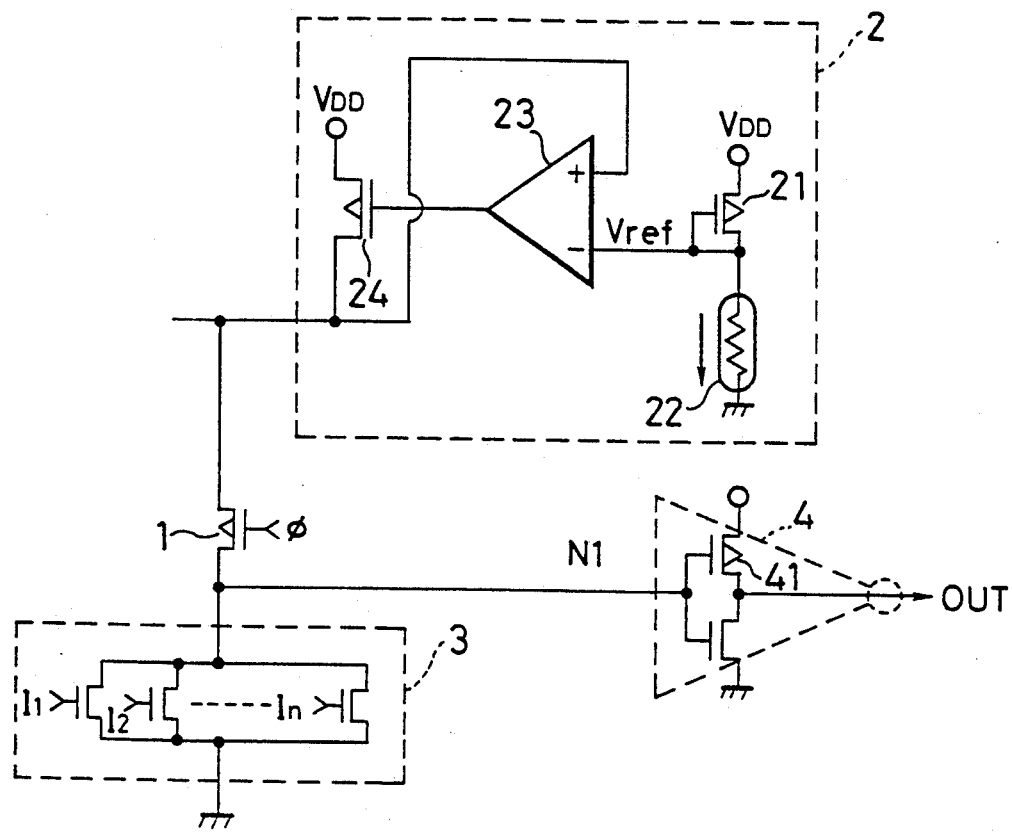
FIGS. 8(a) and 8(b) are views showing a specific example of the arrangement of the logical circuit illustrated in FIG. 4.
Figure 8B:
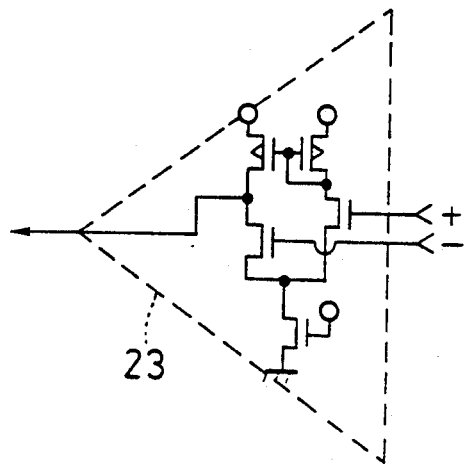

FIGS. 8(a) and 8(b) are views showing a specific arrangement of the logical circuit illustrated in FIG. 4.

In FIG. 8(a), the power-source voltage step-down circuit 2 comprises a reference-voltage generating circuit 5 having a PMOS 21 and a minute constant-current circuit 22, a differential amplifier 23 of current mirror type arranged as shown in FIG. 8(b), and a PMOS 24 for outputting voltage which pre-charge the connecting point N1.

The PMOS 21 of the reference-voltage generating circuit is arranged such that the current which flows in accordance with PMOS 21 is restricted tightly by the minute constant current circuit 22 which, for example, consists of high resistive poly-silicon or long channel transistor. Thus, the reference voltage Vref is set to $V_{DD}-|V_{TP}|$ because the PMOS 21 must be substantially OFF state. Since this reference volatage is applied to one input of differential amplifier 23 and the output of power-source descending circuit 2 is fed back to the other input of the amplifier 23, the output voltage of the power-source descending circuit 2 is controlled so as to be matched with reference voltage Vref; $V_{DD}-|V_{TP}|$.

In the pre-charge condition, through node N1 is pre-charged to descended to voltage from $V_{DD}$; $V_{DD}-|V_{TP}|$, output of the inverter 4 is assured to be "L" because the PMOS 41 forming inverter should also be OFF state in accordance with PMOS 21 in reference generating circuit. Thus, the operational margin is secured. Further, since the PMOS 41 of the inverter circuit 4 is substantially under the non-conductive condition, through current through the inverter circuit 4 is brought to very minute current so that the low consumption power can be realized.

In FIG. 8(a) example, a logical switch consists of a plurality of parallel NMOS transistors and node N1 will be discharged if more than one NMOS becomes ON during evaluation period. In this example, the worst discharging speed is determined by just one NMOS conductance. Parasitic capacitance at node N1 is determined by the sum of all the NMOS drain diffusion capacitance plus wiring capacitance. Therefore, discharging speed at node N1 is restricted.

For the reason discussed above, the pre-charge potential at the connecting point N1 is set lower than the power-source potential $V_{DD}$, whereby, even in the case where the load capacitance of the connecting point N1 is large, it is possible to detect a change in potential with a high speed.

Moreover, in the logical circuit arranged as described above, in order to realize the high operational margin with lower consumption power, threshold voltage at the PMOS 21 of the reference-voltage generating circuit should be set smaller than the threshold voltage of the PMOS of the inverter circuit 4.

Further, the entire logical circuit including the power-source voltage step-down circuit 2 and the inverter circuit 4 is integrated on the same semiconductor substrate, whereby the pre-charge potential at the connecting point N1 and a potential at the switching point in the inverter circuit 4 are aligned with each other. Thus, operation having a margin can be realized against variation in a manufacturing process, the power-source voltage and a change in temperature.

Figure 9:
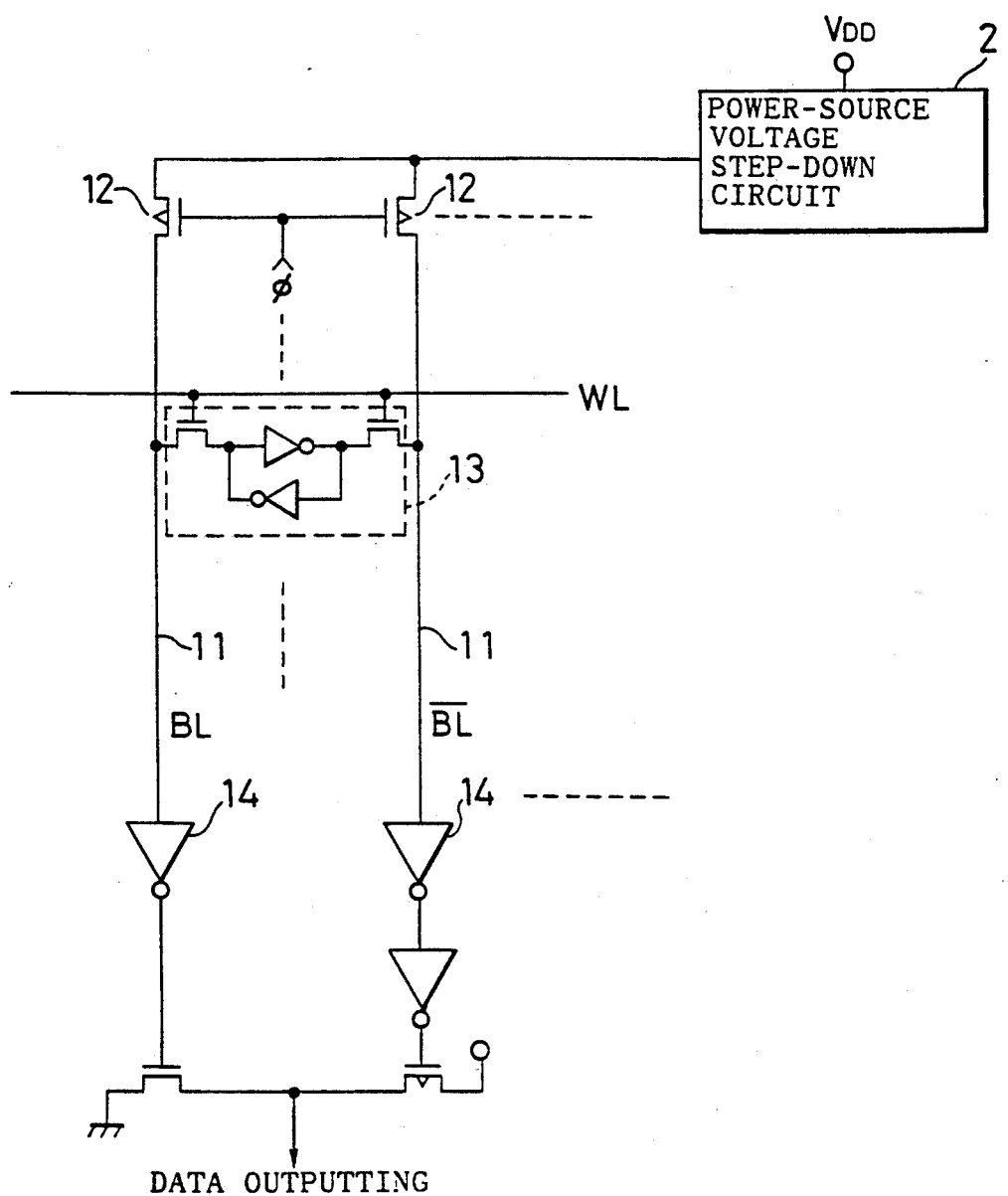
FIG. 9 is a view showing an application example of the invention.

FIG. 9 is a view showing an arrangement in which the logical circuit according to the invention is applied to a memory cell in a RAM of static type and its peripheral circuits. In FIG. 9, the pre-charge transistors for pre-charging bit lines (BL,/BL) corresponding to $MOS_s$ 12 repectively, the logical switch corresponds to the memory cell 13, and the output circuits correspond respectively to the inverters 14.

Generally, packing density is important in a memory cell. Since the transfer gate of the memory cell and the driver transistor are small in size, a drive capacitance of the bit line is lowered. Further, since a large parasitic capacitance is inherent in the bit lines, a speed with which the bit lines are discharged is slow. Accordingly, application of the invention is extremely effective.

Figure 10:
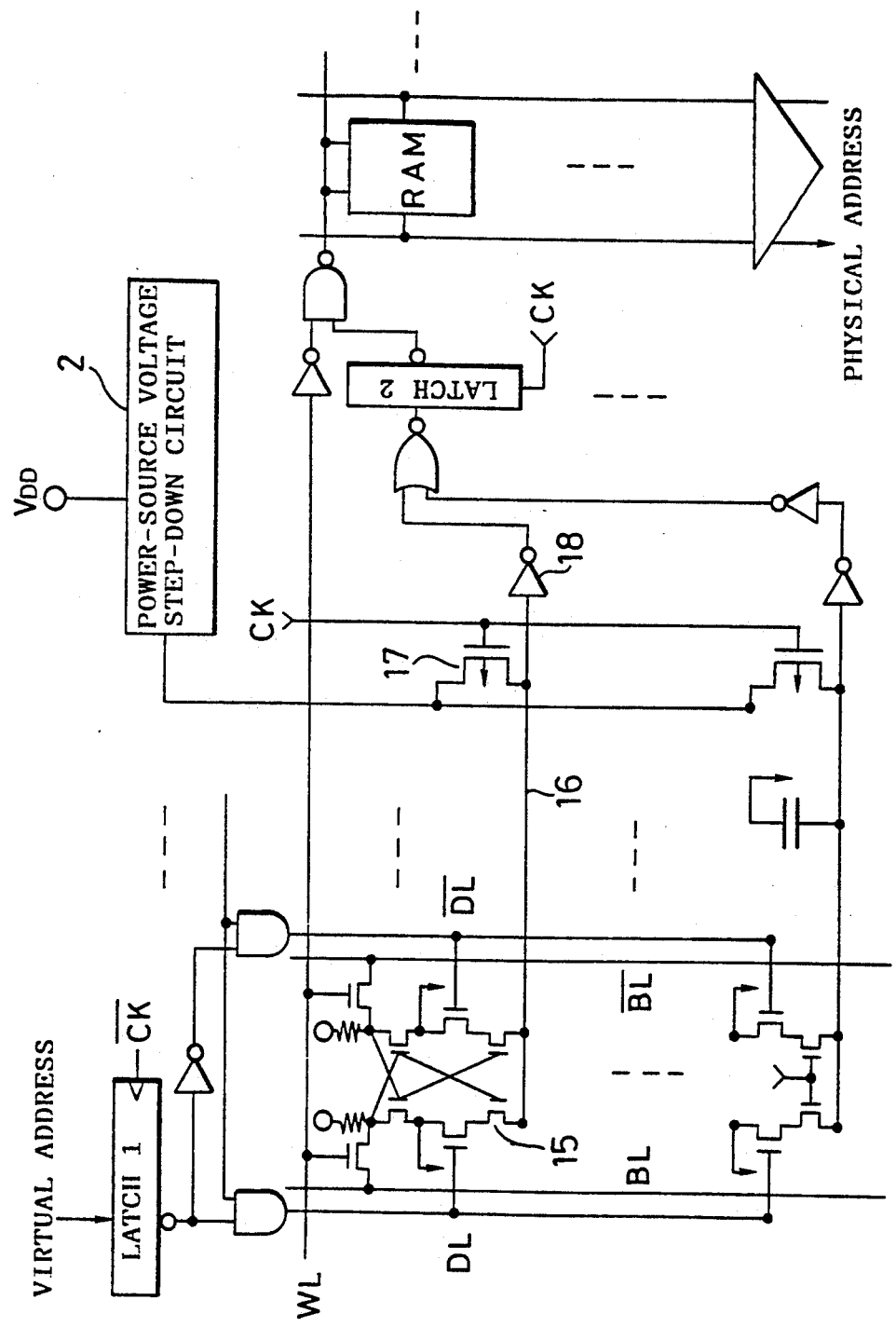
FIG. 10 is a view showing an application example of the invention.

FIG. 10 is a view showing an arrangement in which the logical circuit according to the invention is applied to a TLB (Translation Look-aside Buffer) including content addressable memory (CAM). In FIG. 10, the logical switch corresponds to a memory cell 15 of the CAM, the potential detecting point corresponds to a match line 16, the pre-charge transistor corresponds to a PMOS 17, and the output circuit corresponds to an inverter circuit 18.

With the arrangement described above, since much line discharging speed is restricted, application of the invention is extremely effective.

Figure 11:
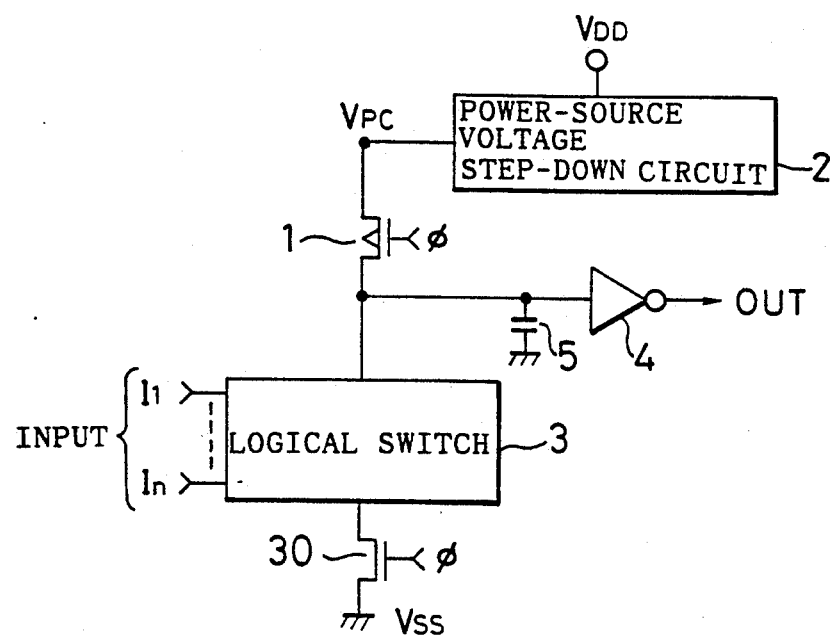
FIG. 11 is a view showing an arrangement of a logical circuit according to another embodiment of the invention.

In connection with the above, the invention should not be limited to the above-described embodiments. For example, as shown in FIG. 11, the arrangement may be such that an NMOS 30 controlled in conductivity by a clock signal is inserted between the logical switch 3 and the ground power source with respect to the logical circuit illustrated in FIG. 4, and an NMOS 30 is brought to a non-conductive condition during a pre-charge period of time of the connecting point N1, thereby preventing through current.

Figure 12:
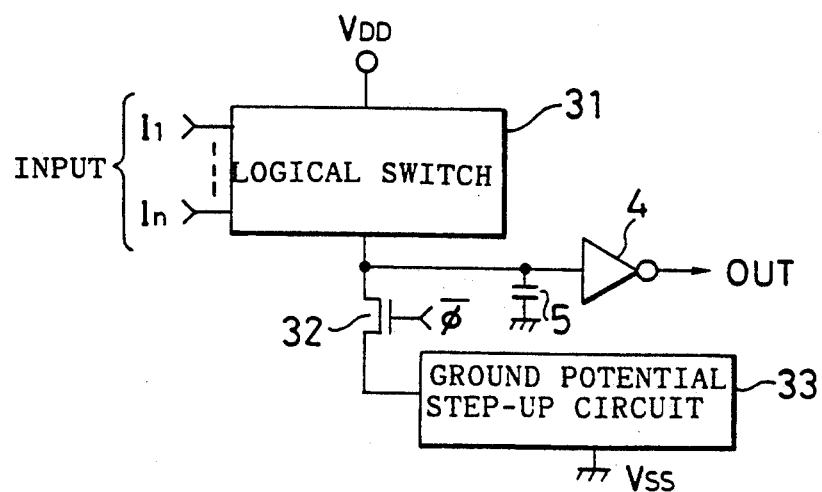
FIG. 12 is a view showing an arrangement of a logical circuit according to still another embodiment of the invention.

Moreover, the above-described embodiments are arranged such that the NMOS higher in conductance than the PMOS is used to form the logical switch 3, to particularly obtain advantageous with respect to an occupied area and speed. As shown in FIG. 12, however, the arrangement may be such that a logical switch 31 is formed by a PMOS, the pre-discharge transistor at the connecting point N1 is formed by an an NMOS 32, and a ground change is detected under a condition that the connecting point N1 is pre-discharged by a ground potential step-up circuit 33 for setting up (raising) the ground power source on the basis of a logic similar to that described above.

As described above, according to the invention, the potential change due to the input signal at the potential detecting point is detected under the condition that the potential at the potential detecting point is set by the potential supplied from the voltage supply means to the potential between the first power-source potential and the potential at the switching point of the output means. With the arrangement of the invention, detection of the potential change can be achieved with a high speed and at a low consumption power, without spoiling the detecting balance and the operation margin. Further, since an amplitude at the potential detecting point is restricted or limited, operation at low consumption power can be realized.

Various modifications will become possible for those skilled in the art after receiving the teachings of the present disclosure without departing from the scope thereof.

What is claimed is:

1. A logic circuit for detecting a potential change at a potential detecting point, the logic circuit comprising:
output means, connected between a first power source potential and a second power source potential lower than said first power source potential, for comparing a potential at said potential detecting point and a potential at a switching point thereof with each other to judge fluctuations of the potential at said potential detecting point;

voltage supply means for supplying a third potential between the potential at said switching point of said output means and said first power source potential, from an output end thereof;

a first FET (field effect transistor) of a first conductivity type for controlling an electrical conductivity between the output end of said voltage supply means and said potential detecting point; and switch means for controlling an electrical conductivity between said potential detecting point and said second power source potential in accordance with an input signal.

2. The logic circuit according to claim 1, wherein said voltage supply means is arranged to decrease said first power source potential to a potential between the potential at said switching point of said output means and said first power source potential, and to supply the decreased potential from the output end of said voltage supply means.

3. The logic circuit according to claim 2, wherein said first power source potential is a high-level potential, while said second power source potential is a ground potential.

4. The logic circuit according to claim 3, wherein said first FET is conducted during a pre-charge period of time, wherein said potential detecting point is precharged by the potential from said potential supply means, wherein, subsequently, said switch means is short-circuited in accordance with an input signal during an evaluation period of time, and wherein said potential detecting point is dropped to the ground potential.

5. The logic circuit according to claim 1, further including a second FET of a second conductivity type, connected to a location between said switch means and said second power source potential, controlled in conductivity to a condition reverse that of said first FET.

6. The logic circuit according to claim 5, wherein, assuming that a threshold voltage of said first FET is $V_T$, said voltage supply means has a supply potential thereof which is higher than the first power source potential $-2|V_T|$.

7. The logic circuit according to claim 6, wherein said voltage supply means comprises:

reference-voltage generating means including an FET of a first conductivity type having a gate terminal thereof connected to a reference-voltage output end and inserted between the first power source potential and said reference voltage output end, and current setting means, connected between said reference voltage output end and said second power source potential, for setting current flowing through said FET of said reference-voltage generating means;

a differential amplifier having one of a pair of input ends to which a reference voltage generated from said reference-voltage generating means is applied, the other input end of said differential amplifier serving as the output end of said voltage supply means; and an FET of a first conductivity type controlled in conductivity by an output from said differential amplifier and connected to a location between a first power source and an output end of said voltage supply means.

8. The logic circuit according to claim 7, wherein said FET of a first conductivity type in said reference voltage generating means has a threshold voltage thereof whose absolute value is smaller than an absolute value of a threshold voltage of one of a plurality of transistors forming said output means.

9. A potential change detection circuit for precharging a node and then detecting a potential change of the precharged node, the circuit comprising:

precharging means for precharging said node to a predetermined precharge level; and a logic circuit provided with a first field effect transistor connected between a high voltage level and an output terminal and having a gate terminal connected with said node, and a second field effect transistor connected between a low voltage level and said output terminal and having a gate terminal connected with said node, wherein said first and second field effect transistors have channel types that are opposite to each other, and said precharge level is selected to be a predetermined level displaced from one of said high and low voltage levels toward the other of said voltage levels by an amount within a range corresponding to twice a threshold value of one of said first and second field effect transistors.

10. The potential change detection circuit as claimed in claim 9, wherein said precharging means is provided with a third field effect transistor through which the precharge of said node is carried out.

11. The potential change detection circuit as claimed in claim 10, wherein said third field effect transistor has a gate terminal through which a clock signal is supplied.

12. The potential change detection circuit as claimed in claim 9, wherein said node is connected to an output line of a memory device.

13. The potential change detection circuit as claimed in claim 12, wherein said memory device is a random access memory.

14. The potential change detection circuit as claimed in claim 12, wherein said memory device is a content-addressable memory.

* * * * *